US010638590B2

United States Patent
Weilguni et al.

(10) Patent No.: US 10,638,590 B2
(45) Date of Patent: Apr. 28, 2020

(54) METHOD FOR FREQUENCY CONTROL OF A PIEZOELECTRIC TRANSFORMER AND CIRCUIT ARRANGEMENT COMPRISING A PIEZOELECTRIC TRANSFORMER

(71) Applicant: EPCOS AG, München (DE)

(72) Inventors: Michael Weilguni, Hagenberg (AT); Markus Puff, Graz (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 15/748,590

(22) PCT Filed: Jul. 8, 2016

(86) PCT No.: PCT/EP2016/066332
§ 371 (c)(1),
(2) Date: Jan. 29, 2018

(87) PCT Pub. No.: WO2017/016853
PCT Pub. Date: Feb. 2, 2017

(65) Prior Publication Data
US 2019/0008027 A1    Jan. 3, 2019

(30) Foreign Application Priority Data
Jul. 29, 2015    (DE) .................. 10 2015 112 410

(51) Int. Cl.
*H05H 1/24* (2006.01)
*H01L 41/04* (2006.01)
*H01L 41/107* (2006.01)

(52) U.S. Cl.
CPC ......... *H05H 1/2475* (2013.01); *H01L 41/044* (2013.01); *H01L 41/107* (2013.01); *H05H 2001/2481* (2013.01)

(58) Field of Classification Search
CPC ... H05H 1/2475; H01L 41/044; H01L 41/107; H01J 37/32036; H01J 37/32449; H01J 37/32899
(Continued)

(56) References Cited

U.S. PATENT DOCUMENTS 5,394,048 A    2/1995   Yamashita et al.
5,796,213 A    8/1998   Kawasaki
(Continued)

FOREIGN PATENT DOCUMENTS

DE    19918607 A1    7/2000
DE    69626455 T2    1/2004
(Continued)

OTHER PUBLICATIONS

Analog Devices, "1 MSPS, 12-Bit Impedance Converter, Network Analyzer," Data Sheet AD5933, Norwood, MA, 2005-2013, pp. 1-40, http://www.analog.com/media/en/technical-documentation/data-sheets/AD5933.pdf.
(Continued)

*Primary Examiner* — Tung X Le
(74) *Attorney, Agent, or Firm* — Slater Matsil, LLP

(57) ABSTRACT

A method for frequency control of a piezoelectric transformer and a circuit arrangement including a piezoelectric transformer are disclosed. In an embodiment, the method includes exciting a piezoelectric transformer on an input side with an AC voltage of predetermined frequency as input voltage, capturing a phase information for an input impedance of the piezoelectric transformer in a feedback path, evaluating the captured phase information in respect of a predetermined phase criterion, and regulating the frequency of the AC voltage on a basis of the evaluated phase information.

13 Claims, 2 Drawing Sheets

(58) Field of Classification Search
USPC .................................................. 315/111.21
See application file for complete search history.

(56) References Cited

U.S. PATENT DOCUMENTS

| | | | |
|---|---|---|---|
| 6,144,139 A | 11/2000 | Noma et al. | |
| 6,226,196 B1 | 5/2001 | Toshinari et al. | |
| 6,348,755 B1 | 2/2002 | Shimamura et al. | |
| 6,566,821 B2 | 5/2003 | Nakatsuka et al. | |
| 7,746,671 B2 | 6/2010 | Radecker et al. | |
| 8,115,366 B2 | 2/2012 | Hoffman et al. | |
| 9,705,064 B2 | 7/2017 | Kraxner et al. | |
| 9,788,404 B2 | 10/2017 | Nettesheim et al. | |
| 2009/0135538 A1* | 5/2009 | Yasuoka | H01T 23/00 361/213 |
| 2010/0295488 A1 | 11/2010 | Shibatani | |
| 2010/0301702 A1* | 12/2010 | Tao | H01L 41/044 310/318 |
| 2016/0113103 A1* | 4/2016 | Van Zyl | H05H 1/46 315/111.21 |
| 2016/0163514 A1* | 6/2016 | Fisk, II | H01J 37/32174 315/111.21 |
| 2017/0049496 A1* | 2/2017 | Konesky | A61B 18/1233 |

FOREIGN PATENT DOCUMENTS

| | | |
|---|---|---|
| DE | 102004016196 A1 | 11/2005 |
| DE | 102006022845 A1 | 12/2006 |
| DE | 60128535 T2 | 1/2008 |
| DE | 102013100617 A1 | 7/2014 |
| DE | 102013103159 A1 | 10/2014 |
| JP | S61220386 A | 9/1986 |
| JP | 2000312498 A | 11/2007 |
| JP | 2009129673 A | 6/2009 |
| JP | 2010273439 A | 12/2010 |
| JP | 2012507208 A | 3/2012 |
| KR | 20000040964 A | 7/2000 |
| WO | 2014115050 A | 7/2014 |

OTHER PUBLICATIONS

Horowitz, P. et al., "The Art of Electronics," 2nd Edition, Cambridge Univ. Press, ISBN 0-521-37095-7, Chapter 9, 1994, 2 pages.
Itoh, H., et al., "Discharge plasmas generated by piezoelectric transformers and their applications," Plasma Sources Science and Technology, vol. 15, No. 2, Apr. 24, 2006, pp. 1-11.
Williams, J., "Ultracompact LCD Backlight Inverters," Linear Technology, Application Note 81, Sep. 1999, pp. 1-8.

* cited by examiner

METHOD FOR FREQUENCY CONTROL OF A PIEZOELECTRIC TRANSFORMER AND CIRCUIT ARRANGEMENT COMPRISING A PIEZOELECTRIC TRANSFORMER

This patent application is a national phase filing under section 371 of PCT/EP2016/066332, filed Jul. 8, 2016, which claims the priority of German patent application 10 2015 112 410.6, filed Jul. 29, 2015, each of which is incorporated herein by reference in its entirety.

TECHNICAL FIELD

The invention relates to a method for frequency regulation for a piezoelectric transformer and to a circuit arrangement, comprising a piezoelectric transformer and an AC voltage source for producing an input voltage on an input side of the piezoelectric transformer.

BACKGROUND

Piezoelectric transformers allow the conversion of a supplied AC voltage as input voltage on an input side into a higher or lower AC voltage as output voltage on an output side of a piezoelectric element. The piezoelectric element is frequently constructed from a lead zirconate titanate compound (PZT). On the basis of an appropriate polarization of the input and output sides of the piezoelectric element, the latter is deformed, e.g., in the thickness direction when a sinusoidal AC voltage is applied on the input side on account of the inverse piezoelectric effect, as a result of which an oscillation is produced in the longitudinal direction of the piezoelectric element. This in turn produces a corresponding output voltage on the output side on account of the direct piezoelectric effect.

If the frequency of the applied input voltage matches the resonant frequency of the piezoelectric element, this results in an electromechanical resonance of the element, which means that the mechanical vibration reaches a maximum. In this manner, a very high output voltage can be produced on the output side of the piezoelectric element. One application involves, by way of example, operating a piezoelectric transformer as a plasma generator, wherein ionization of an operating gas flowing around the plasma generator takes place on account of a high output voltage on the output side of the plasma generator, so that a plasma is produced.

When operating a piezoelectric transformer, it is further always desirable to operate the transformer at a maximum efficiency. The maximum efficiency can only ever be achieved at one particular frequency. This frequency is dependent on numerous parameters, inter alia on the input voltage and the operating environment used. Finding the maximum efficiency therefore requires information from the component.

There are already multiple possibilities for the frequency regulation of conventional piezoelectric transformers. For example, the voltage on the secondary side (output voltage) can be considered. Another possibility is the use of an additional electrode on the transformer to obtain a feedback signal.

A disadvantage in the case of the first possibility is that every instance of the output voltage being tapped off influences the amplitude of the output voltage and hence the oscillatory response of the piezo element and finally the manner of operation of the piezoelectric transformer. Particularly when the piezoelectric transformer is used as a plasma generator, such a possibility for the frequency regulation would have a greatly adverse influence on the manner of operation of the plasma generator.

By contrast, the second variant has the disadvantage that it necessitates further contact connection of the piezoelectric component, which complicates the design.

SUMMARY OF THE INVENTION

Embodiments provide regulating a piezoelectric transformer, e.g., a piezoelectric plasma generator, in respect of the frequency such that it is (always) operated at maximum efficiency and the manner of operation is nevertheless influenced as little as possible given a simple design.

In various embodiments the method comprises the steps of: exciting a piezoelectric transformer on an input side with an AC voltage of predetermined frequency as input voltage, capturing a phase information for the input impedance of the piezoelectric transformer in a feedback path, evaluating the captured phase information in respect of a predetermined phase criterion, and regulating the frequency of the AC voltage on the basis of the evaluated phase information.

In various further embodiments, a phase information, that is to say an information about the phase angle between sinusoidal input voltage and sinusoidal input current, which corresponds to the phase angle of the input impedance, is detected. Finally, the frequency of the AC voltage can be regulated on the basis of the evaluated phase information.

The advantage of such a method is that, for a frequency regulation, only an information captured on the input side of the piezoelectric transformer is used as a criterion for the frequency regulation. In this manner, the operating response of the piezoelectric transformer is barely or only insignificantly influenced in practice. In particular, the tapping-off of signal information on the output side of the piezoelectric transformer is dispensed with. Nevertheless, the piezoelectric transformer can always be operated under optimum conditions solely on the basis of the information captured on the input side. A crucial advantage in comparison with conventional concepts is the high efficiency that can be attained in the process.

A principle of the method is that, solely on the basis of the phase or the phase angle of the input impedance of the piezoelectric transformer, it is possible to operate the transformer at maximum efficiency each time under arbitrary external conditions. This means that solely on the basis of an evaluation of the captured phase information in respect of a predetermined phase criterion, it is possible for a particular operating frequency at which the predetermined phase criterion is satisfied and a maximum efficiency exists to be inferred algorithmically. Therefore, the piezoelectric transformer can be regulated to an operating frequency of the AC voltage, so that the transformer operates at a maximum efficiency at this frequency.

The method may involve the predetermined phase criterion advantageously being chosen as one or more zeros or a local extreme of the phase angle of the input impedance as a function of the frequency of the AC voltage. For example, the local extreme may be a local minimum of the phase angle of the input impedance. The evaluating of the captured phase information advantageously comprises a rating of the adequate satisfaction of the predetermined phase criterion. The characteristic of the phase angle of the input impedance as a function of the frequency of the AC voltage therefore permits conclusions to be drawn about particular operating frequencies at which an efficiency of the piezoelectric transformer is optimum under particular operating conditions.

Mathematical formulation of one or more of these phase criteria and appropriate implementation of regulation may allow continuous regulation of the frequency to be effected such that the captured phase information is always evaluated to establish whether the phase criterion/criteria is/are adequately satisfied. It is therefore possible to regulate to an operating frequency accompanied by a corresponding phase criterion as the optimum operating frequency of the piezoelectric transformer with maximum efficiency. In this manner, it is possible to ascertain an optimum operating frequency of the piezoelectric transformer solely by evaluating the phase angle over the frequency.

In one possible configuration, a phase detector in the feedback path is used to compare a signal of the input voltage with a signal proportional to the input current on the input side of the piezoelectric transformer, and from this an output signal of the phase detector is ascertained. This output signal of the phase detector is proportional to the absolute value of the phase angle between the input voltage and the input current and serves as phase information for the input impedance of the piezoelectric transformer. Such measures allow the phase offset of these two electrical variables to be inferred using simple means on the basis of a comparison of input voltage and input current.

In another configuration, an impedance analyzer in the feedback path is used to sample a signal proportional to the input current on the input side of the piezoelectric transformer. A Fourier transformation is used to compute the phase angle of the signal from the samples, which phase angle finally serves as phase information for the input impedance of the piezoelectric transformer. In this manner too, it is possible for the phase angle for regulating the optimum operating frequency to be ascertained.

Advantageously, the method of the type explained involves the piezoelectric transformer being operated as a plasma generator such that an input voltage at a frequency regulated in accordance with the method, on the input side, is converted into an output voltage, as a result of which a plasma is produced on the output side on account of ionization of an operating gas flowing around the plasma generator. The operating gas may be air or else a noble gas (e.g., argon), for example.

Particularly when the piezoelectric transformer is accordingly operated as a plasma generator, a frequency at which the plasma generator has a maximum efficiency is dependent on numerous parameters, inter alia also on the operating environment used (operating gas, temperature, etc.). The explained method for frequency regulation can be used to adapt the operation of the plasma generator, particularly its operating frequency, to suit different operating environments and operating conditions. On account of the purely input-side capture of the required information for the frequency regulation, the operating response of the plasma generator on its output side, and hence the plasma production, is not adversely influenced. Nevertheless, the plasma generator can be operated under always optimum conditions. As a result, heating of the piezoelectric element or component is also reduced to a minimum. Moreover, the plasma generator can also be operated at higher plasma powers.

A further advantage of the application of the explained method for frequency regulation during operation of a piezoelectric plasma generator is that it is possible to react to an operating error (e.g., ignition against conductive items, touching, etc.). The reason is that such situations result in the phase or the phase angle of the input impedance being greatly altered, this being able to be recognized by the method explained. As a result, actuation can reduce the input power, for example.

In a further aspect, the aforementioned object is achieved by a circuit arrangement according to claim 6. The circuit arrangement comprises: a piezoelectric transformer having an input side and an output side, an AC voltage source for producing an input voltage of predetermined frequency on the input side of the piezoelectric transformer, a detection apparatus that is set up in a feedback path between the input side of the piezoelectric transformer and the AC voltage source to capture a phase information for the input impedance of the piezoelectric transformer, and a regulating apparatus that is set up to evaluate the captured phase information in respect of a predetermined phase criterion and to prescribe a frequency for producing the input voltage to the AC voltage source on the basis of the evaluated phase information.

In comparison with conventional regulating arrangements for frequency regulation of a piezoelectric transformer, such a circuit arrangement has the advantage that frequency regulation of the piezoelectric transformer can be performed solely by an information captured on the input side of the transformer. As already explained in connection with the method above, the frequency regulation is effected on the basis of a captured phase information for the input impedance of the piezoelectric transformer. This allows a simple design of the circuit arrangement and nevertheless optimum regulation of the transformer in respect of an operating frequency at maximum efficiency. Further, the circuit arrangement does not adversely influence the operation of the transformer because the information needed for regulation is tapped off only on the input side of the piezoelectric transformer.

In one possible embodiment, the detection apparatus comprises a phase detector that is connected up such that the signal of the input voltage is applied to a first input of the phase detector and a signal proportional to the input current on the input side of the piezoelectric transformer is applied to a second input of the phase detector. In this case, the phase detector is set up to output an output signal that comprises the phase information of the input impedance at an output. Such a phase detector allows the phase information of the input impedance to be captured in a simple manner.

In accordance with an alternative embodiment, the detection apparatus comprises an impedance analyzer that is connected up such that a signal proportional to the input current on the input side of the piezoelectric transformer is applied to the input of said impedance analyzer. The impedance analyzer is set up to sample the signal and to supply the samples to a Fourier transformation to compute the phase angle of the signal. This phase angle corresponds to the phase angle of the input impedance of the piezoelectric transformer.

Advantageously, the piezoelectric transformer in the circuit arrangement of the type explained is a piezoelectric plasma generator that is set up to produce an output high voltage on the output side from the input voltage on the input side, so that a plasma is produced on the output side on account of ionization of an operating gas flowing around the plasma generator.

Further advantageous embodiments are disclosed in the subclaims and in the description of the figures that follows.

BRIEF DESCRIPTION OF THE DRAWINGS

The invention is explained in more detail below on the basis of exemplary embodiments with the aid of multiple figures, in which.

DETAILED DESCRIPTION OF ILLUSTRATIVE EMBODIMENTS

Figure 1:
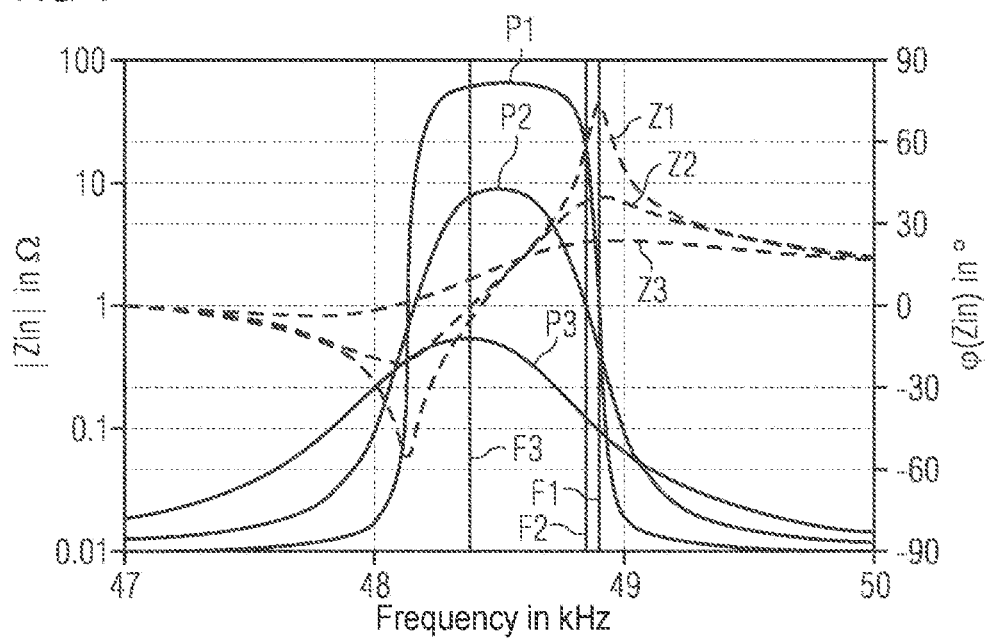
FIG. 1 shows different characteristics for the absolute value and also the phase angle of the input impedance of a piezoelectric plasma generator over frequency.

FIG. 1 shows different characteristics Z1, Z2, Z3 for the absolute value of the input impedance ("|Zin|") in ohms (Ω) of a piezoelectric plasma generator and also different characteristics P1, P2, P3 for the corresponding phase angle phi of the input impedance ("φ(Zin)") in degrees)(°) over frequency in kHz. The explanations that follow relate to actuation of the piezoelectric plasma generator at antiresonance. The underlying principle is also valid for plasma generators that are designed for operation at resonance, however.

Figure 2:
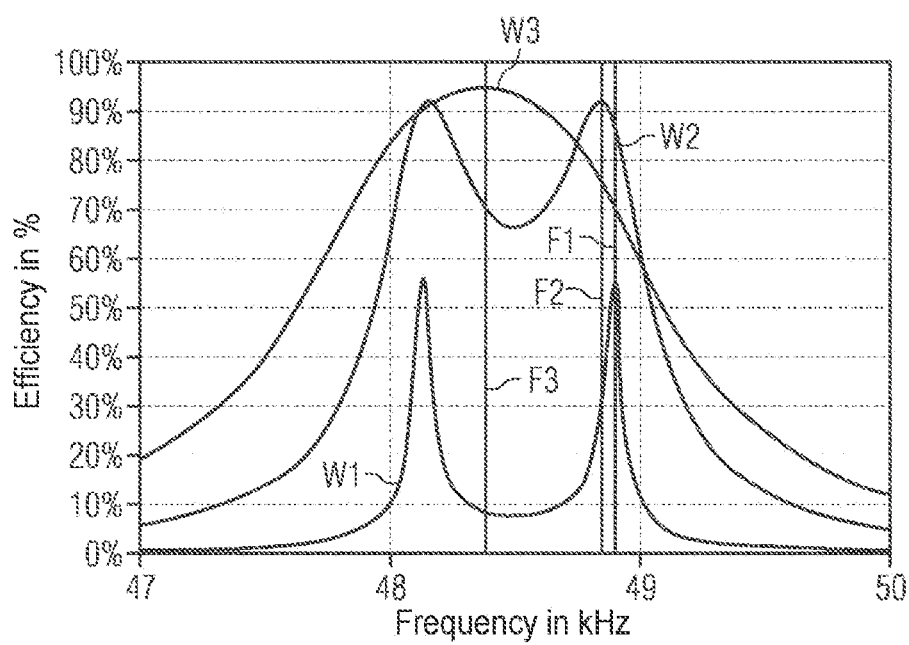
FIG. 2 shows different characteristics for the efficiency of the piezoelectric plasma generator in connection with FIG. 1 over frequency.

FIG. 1 shows different operating responses from an accordingly operated plasma generator. The characteristics Z1 and P1 represent a first operating response. In this case, the plasma generator is excited with a low input voltage, so that the output voltage is not high enough to generate a plasma. In this case, the plasma generator can be described as a piezoelectric transformer during no-load operation. The efficiency in this case is highest at a phase angle of 0° and at the same time at a maximum of the impedance. This is illustrated in FIG. 1 by the fact that the characteristic curve P1 comprises a zero crossing at the frequency F1 (see vertical marker), at which there is a maximum for the absolute value of the impedance Z1. FIG. 2 shows a local maximum at the corresponding frequency (see vertical marker F1) in the characteristic of the efficiency W1.

If the input voltage is increased, then the plasma generator begins to generate plasma. This response can be described approximately as a voltage-dependent load resistance at the output of the piezoelectric plasma generator. This operating response is represented in FIG. 1 by the characteristic curves P2 and Z2. In contrast to the response of the characteristic curves P1 and Z1, the efficiency in this operating response is no longer highest at a maximum of the impedance (see, e.g., local maximum of the characteristic curve Z2 in FIG. 1), but rather at a phase angle of 0° (see, e.g., zero of the characteristic curve P2 at a correspondingly lower frequency F2). FIG. 2 shows this response, in the case of which the characteristic of the efficiency W2 has a local maximum at F2.

If the voltage at the input of the plasma generator is increased further, then there is a point at which the inductive response of the component disappears completely and the phase angle is always less than 0°. See the shape of the characteristic curves P3 and Z3 in FIG. 1. In this case, the maximum efficiency is at a maximum of the phase angle P3 at the frequency F3. In this regard, see, e.g., also the local maximum of the efficiency characteristic W3 in FIG. 2 at the frequency F3.

From the examinations explained above, as evidenced by FIGS. 1 and 2, it follows that it is possible, solely on the basis of the frequency-dependent characteristic of the phase angle, to operate the plasma generator at maximum efficiency each time under arbitrary external conditions.

This insight can be exploited for frequency regulation of the plasma generator.

Figure 3A:
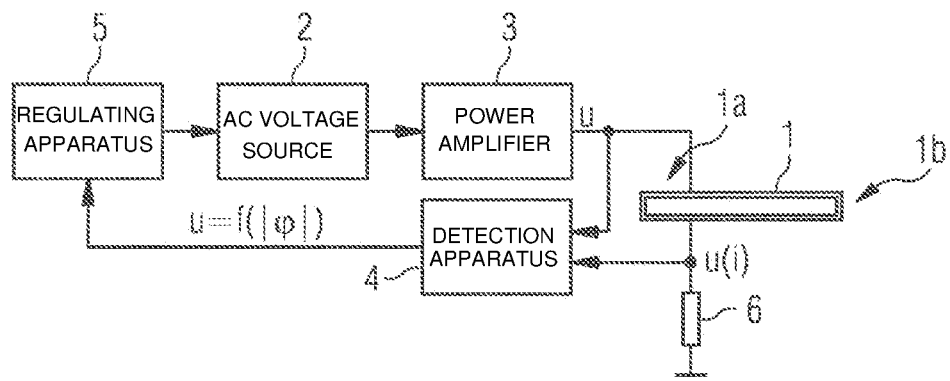
FIG. 3A shows a circuit arrangement for frequency regulation for a piezoelectric plasma generator in accordance with an embodiment.

FIG. 3A shows an embodiment of a circuit arrangement for frequency regulation for a corresponding plasma generator. In particular, the circuit arrangement comprises a piezoelectric transformer 1 that operates as a piezoelectric plasma generator. The piezoelectric transformer 1 comprises an input side 1a and an output side 1b. Connected on the input side is an AC voltage source 2 that produces a sinusoidal AC voltage to excite the piezoelectric transformer 1 on the input side 1a thereof. The AC voltage source 2 may be a DDS (direct digital synthesis) sine generator, for example. However, it is also possible for the AC voltage source 2 to be embodied as an analog voltage controlled oscillator (VCO).

The AC voltage produced in this way is preamplified by means of a power amplifier 3, so that an input voltage signal u is applied on the input side 1a of the piezoelectric transformer 1. This input voltage u can be used to excite the piezoelectric transformer 1 into mechanical oscillation, so that the output side 1b thereof produces an output high voltage for plasma production for an operating gas flowing around the piezoelectric transformer 1, e.g., air.

Further, a detection apparatus 4 is set up in a feedback path of the circuit arrangement shown in FIG. 3A, to which detection apparatus both the input voltage signal u and a signal u(i) are supplied. The latter is a voltage signal proportional to the input current i on the input side 1a of the transformer 1. The signal u(i) is obtained via a current shunt 6. The two signals u and u(i) are processed in the detection apparatus 4 to produce an output signal u=f(|φ|) (voltage signal as a function of the absolute value of the phase angle of the input impedance of the transformer 1). In this embodiment, the output signal is proportional to the absolute value of the phase angle. In other words, the output signal of the detection apparatus 4 represents a phase information, specifically the phase offset (phase angle) between the time-dependent input voltage u and the time-dependent input current (represented by the signal u(i)) on the input side 1a of the transformer 1.

The output signal of the detection apparatus 4 is additionally supplied to a regulating apparatus 5 that evaluates the output signal. On the basis of this evaluation, a new frequency (or a frequency altered by a particular absolute value) is possibly computed that is supplied to the AC voltage source 2 as an actuating signal. The regulating apparatus 5 may be set up as a microcontroller, for example. In particular, the regulating apparatus 5 evaluates the phase information that is captured by means of the detection apparatus 4 and output as an output signal to determine whether or not the captured phase angle of the input impedance of the transformer 1 satisfies a predetermined phase criterion. In this context, the regulating apparatus 5 advantageously evaluates the adequate satisfaction or reaching of a zero crossing (zero) or of a local extreme of the phase angle. As explained with regard to FIG. 1 and FIG. 2, this is because the maximum efficiencies of the transformer 1 that can be attained are located at these points of the characteristics of the applicable phase angle over frequency in the respective operating situations.

It is conceivable for regulation to be performed starting from a particular frequency such that the frequency is changed continuously and the captured phase angle of the input impedance of the transformer is evaluated in accordance with the explained measures in respect of the approach toward and finally adequate satisfaction of the predetermined phase criterion. This regulation can be effected during continuous operation of the piezoelectric transformer 1. Alternatively, it is also conceivable for a predetermined frequency band to be initially swept for a specific operating situation (e.g., by means of a sweep or chirp signal), and for the phase angle to be evaluated in respect of the desired phase criterion and to be subsequently regulated to the suitable frequency by which the phase criterion is adequately satisfied. Thereafter, the piezoelectric transformer 1 can be operated at this frequency in optimum fashion. In this case, it is additionally also possible for further readjustment to be effected during operation, e.g., if particular operating parameters such as operating gas volume, temperature, etc. change.

If a captured phase information satisfies an explained phase criterion adequately (e.g., in a predetermined small range around the defined phase criterion), then the transformer 1 shown in FIG. 3A can be operated at an optimum efficiency at the corresponding frequency. The circuit arrangement shown in FIG. 3A therefore has the advantage that a captured phase information for the input impedance of the transformer 1 can be used to regulate to an optimum operating frequency at which a predetermined phase criterion (see, e.g., FIGS. 1 and 2) is satisfied.

Figure 3B:
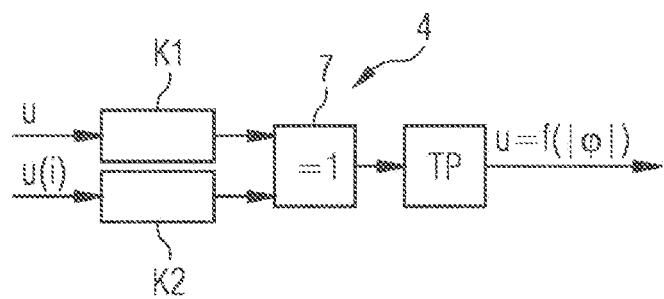
FIG. 3B shows the design of a detection apparatus in a circuit arrangement as shown in FIG. 3A.

FIG. 3B shows the detection apparatus 4 shown in FIG. 3A in a detail view. In this case, the detection apparatus 4 is embodied as a phase detector. First, the input voltage signal u and the signal u(i), which is proportional to the input current, are supplied to a respective comparator K1 and K2 to determine the zero crossing of the respective signals. Subsequently, the signals processed in this way are applied to the inputs of an XOR (Exclusive OR) gate 7. The XOR gate 7 outputs a high level at its output so long as the signals u and u(i) have opposite arithmetic signs. Conversely, the XOR gate 7 outputs a low level so long as the signals u and u(i) have the same arithmetic sign. The output signal of the XOR gate 7 is further forwarded to a low-pass filter TP that averages the signal of the XOR gate 7. The output signal u=f(|φ|) (voltage signal as a function of the absolute value of the phase angle of the input impedance of the transformer 1) obtained in this way is zero if the signals u and u(i) are in phase. If the signals have a phase shift of +180 degrees or −180 degrees, then the output signal is at a maximum.

In this manner, although the phase detector 4 embodied in this way cannot distinguish between positive and negative phases, a signal (phase signal) is obtained that is proportional to the absolute value of the phase angle. This signal can be transferred to the regulating apparatus 5 (see, e.g., FIG. 3A), in which an appropriate algorithm is used to ascertain the approach toward and reaching of the desired phase criterion that finally leads to the optimum operating frequency by iteratively changing the frequency and evaluating the phase signal. An appropriate algorithm can comprise a zero method and/or an extreme value search algorithm, for example. By way of example, it is also conceivable to use LQ regulating methods for the optimized finding of an optimum phase criterion (as a Q factor functional) to determine the appropriate operating frequency. In this case, all kinds of regulating algorithms or even combinations of corresponding methods are conceivable.

Figure 4:
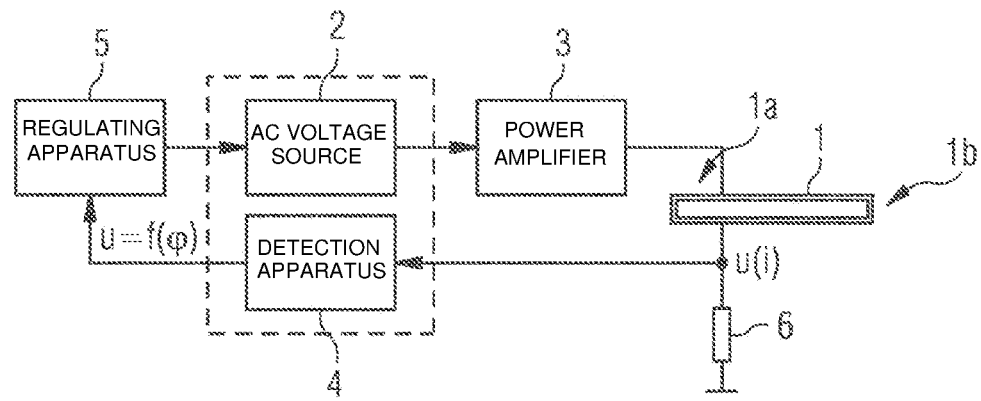
FIG. 4 shows a circuit arrangement for frequency regulation for a piezoelectric plasma generator in accordance with a further embodiment.

FIG. 4 shows an alternative embodiment of a circuit arrangement for frequency regulation for a piezoelectric transformer 1. Some essential components of the circuit arrangement correspond to those of the circuit arrangement shown in FIG. 3A. The only difference in the circuit arrangement shown in FIG. 4 is that the detection apparatus 4 and the AC voltage source 2 are structurally combined in one module and the detection apparatus 4 is set up as an impedance analyzer. Therefore, the detection apparatus 4 in the feedback path of the circuit arrangement merely has a voltage signal u(i) transferred to it that, analogously to FIG. 3A, is formed by means of a current shunt 6 and is proportional to the input current on the input side is of the piezoelectric transformer 1. The signal u(i) is oversampled in the impedance analyzer 4 and the applicable phase angle of the signal is determined from the samples by Fourier transformation. This can involve an algorithmic method of a fast Fourier transformation (FFT) being applied, for example. An appropriate output signal u=f(φ) can then be transferred to the regulating apparatus 5 and evaluated therein conveniently. The regulating apparatus 5 can adjust the frequency as a manipulated variable for the AC voltage source 2 using software, for example. Evaluation of the phase angle using an impedance analyzer 4 as shown in FIG. 4 has the advantage that the arithmetic sign of the phase angle can also be taken into consideration and incorporated into an evaluation.

The depicted embodiments are chosen merely by way of example. The regulating method explained herein and the circuit arrangement explained allow frequency regulation for a piezoelectric transformer, particularly a piezoelectric plasma generator, to set an optimum operating frequency in respective operating situations such that the piezoelectric transformer can be operated at an optimum efficiency. The advantage of the method and of the circuit arrangement is that an appropriate regulatory information is obtained merely from signals that can be tapped off on an input side of the transformer. In this manner, tapping-off and feedback of signals on an output side of the transformer, as a result of which the operation of the transformer would be adversely influenced, are dispensed with. Further, a corresponding circuit arrangement allows a simple design.

The invention claimed is:

1. A method for frequency regulation for a piezoelectric transformer, the method comprising:
    exciting, by an AC voltage source, the piezoelectric transformer on an input side with an AC voltage of a predetermined frequency as an input voltage;
    capturing, by a detector, a phase information for an input impedance of the piezoelectric transformer in a feedback path;
    evaluating, by a regulator, the captured phase information with respect of a predetermined phase criterion; and
    regulating, by the regulator, the frequency of the AC voltage based on the evaluated phase information.

2. The method according to claim 1, wherein the predetermined phase criterion is chosen as a zero or a local extreme of a phase angle of the input impedance as a function of the frequency of the AC voltage, and wherein evaluating the captured phase information comprises a rating of an adequate satisfaction of the predetermined phase criterion.

3. The method according to claim 1, wherein the detector in the feedback path compares a signal of the input voltage with a signal proportional to an input current on the input side of the piezoelectric transformer so that the detector generates an output signal that is proportional to an absolute value of an phase angle between the input voltage and the input current and serves as phase information for the input impedance of the piezoelectric transformer.

4. The method according to claim 1, further comprising sampling a signal proportional to an input current on the input side of the piezoelectric transformer, and using a Fourier transformation to compute an phase angle of the signal from the samples, wherein the phase angle serves as phase information for the input impedance of the piezoelectric transformer.

5. The method according to claim 4, wherein sampling the signal is performed by an impedance analyzer.

6. A method for operating a piezoelectric transformer as a plasma generator, the method comprising:
applying an input voltage at a frequency regulated in accordance with the method of claim 1, on the input side; and
converting the input voltage to an output high voltage so that a plasma is produced on an output side on account of ionization of an operating gas flowing around the plasma generator.

7. A circuit arrangement comprising:
a piezoelectric transformer having an input side and an output side;
an AC voltage source configured to produce an input voltage of a predetermined frequency on the input side of the piezoelectric transformer;
a detector located in a feedback path between the input side of the piezoelectric transformer and the AC voltage source, wherein the detector is configured to capture a phase information for an input impedance of the piezoelectric transformer; and
a regulator configured to evaluate the captured phase information with respect to a predetermined phase criterion and to prescribe a frequency for producing the input voltage to the AC voltage source on a basis of the evaluated phase information.

8. The circuit arrangement according to claim 7, wherein the detector comprises a phase detector arranged such that an signal of the input voltage is applied to a first input of the phase detector and a signal proportional to an input current on the input side of the piezoelectric transformer is applied to a second input of the phase detector, and wherein the phase detector is configured to output an output signal that comprises the phase information of the input impedance at an output.

9. The circuit arrangement according to claim 8, wherein the phase detector comprises an XOR gate and a low-pass filter, which are connected in series, and wherein an arithmetic sign signal for the input voltage is applied to a first input of the XOR gate and an arithmetic sign signal proportional to the input current on the input side of the piezoelectric transformer is applied to a second input of the XOR gate such that an output signal is producible at the output of the XOR gate as a comparison signal that is to be averaged by the low-pass filter to produce a signal that is proportional to an absolute value of an phase angle of the input impedance of the piezoelectric transformer.

10. The circuit arrangement according to one of claim 9, wherein the piezoelectric transformer is part of a piezoelectric plasma generator configured to produce an output high voltage on the output side from the input voltage on the input side so that a plasma is produced on the output side on account of ionization of an operating gas flowing around the plasma generator.

11. The circuit arrangement according to claim 7, wherein the detector comprises an impedance analyzer arranged such that a signal proportional to an input current on the input side of the piezoelectric transformer is applied to the input of the impedance analyzer.

12. The circuit arrangement according to claim 11, wherein the impedance analyzer is arranged to sample the signal and to supply samples to a Fourier transformation to compute an phase angle of the signal, which corresponds to the phase angle of the input impedance of the piezoelectric transformer.

13. The circuit arrangement according to claim 7, wherein the piezoelectric transformer is a piezoelectric plasma generator configured to produce an output high voltage on the output side from the input voltage on the input side so that a plasma is to be produced on the output side on account of ionization of an operating gas flowing around the plasma generator.

* * * * *